Oct. 19, 1965 A. J. CLARK 3,212,343

TUNING APPARATUS

Filed June 25, 1964 2 Sheets-Sheet 1

INVENTOR.

Alfred J. Clark

BY Mueller & Aichele

Attys.

INVENTOR.
Alfred J. Clark
BY Mueller & Aichele
Att'ys.

United States Patent Office 3,212,343
Patented Oct. 19, 1965

3,212,343
TUNING APPARATUS

Alfred J. Clark, Palatine, Ill., assignor to Motorola, Inc., Franklin Park, Ill., a corporation of Illinois
Filed June 25, 1964, Ser. No. 377,947
7 Claims. (Cl. 74—10.37)

This invention relates to tuning apparatus for a radio receiver which is selectively operable in AM and FM modes, and more particularly to pushbutton tuning apparatus which may be pre-programmed so that each pushbutton may be depressed to select a frequency for either AM or FM reception.

Combination AM-FM radio receivers mounted in automobiles are rapidly gaining popularity. Pushbutton tuning of automobile radios has always been a significant feature because of the convenience and minimization of distraction it affords to the driver. Combination AM-FM radio receivers have been provided with a separate group of pushbuttons for FM tuning in addition to the pushbuttons provided for AM tuning. This limits the number of frequencies available for AM or FM listening, or requires a large number of pushbuttons which increases cost and gives the dash panel of the automobile a cluttered appearance. If the number of pushbuttons provided for the combination AM-FM radio is limited to the five or so buttons now used for conventional AM receivers, versatility may be curtailed unless any one of the buttons can be pre-programmed by the user to pre-select either an AM or an FM station.

Heretofore, certain attempts to develop tuning apparatus for combination AM-FM radios, which contained pushbuttons capable of being pre-programmed by the user to select either AM or FM stations, have involved complex structures and elaborate switching systems. Often the result of such complexity and elaborateness would render a turner unreliable and difficult to operate.

Accordingly, it is an object of this invention to provide improved pushbutton tuning apparatus for combination AM-FM radio receivers.

Another object of the invention is to provide reliable low cost pushbutton tuning apparatus for an AM-FM radio receiver wherein any one of the pushbuttons may be pre-programmed to select either an AM or an FM station.

A feature of the invention is the provision, in a pushbutton operable tuning mechanism for use in a combination AM-FM radio receiver, of a transversely movable member for controlling the mode of receiver operation, which member carries a plurality of bistable cams respectively engageable by one of a plurality of pushbutton actuable tuning assemblies to displace the transversely movable member.

Another feature of the invention is the provision of a linearly displaceable pushbutton cam slide assembly for adjustably positioning a tuning carriage, which assembly has a cam engaging portion thereon engageable with an adjustable cam on the surface of a transversely movable AM-FM selector switch actuating member.

Still another feature of the invention is the provision of a tuning device comprising a plurality of linearly depressible pushbutton assemblies, and of bistable cams mounted on a transversely movable AM-FM selector switch actuating member, with the pushbutton assemblies each having an extension thereon engageable with a respective cam member when the pushbutton assembly is unlocked so that the actuating member may be moved to change the position of the bistable cam.

In accordance with the inventon, a turning device for a combination AM-FM radio receiver includes a plurality of linearly displaceable pushbutton operated slide assemblies. Each of the assemblies carries a presettable cam for opearting the tuner, according to principles well known in the art. A selector switch is provided for conditioning the receiver for AM and FM reception and includes an actuating plate which is linearly displaceable transversely of the slide assemblies to AM and FM positions. The actuating member carries a plurality of bistable cam members, each aligned with a respective one of the slide assembies. Each slide assembly is provided with a cam engaging portion engageable with the bistable cam member associated therewith when the slide assembly is displaced to align the treadle bars. The cam members are stable in either of the two positions to present oblique surfaces for engagement by the cam engaging portions of the slide assemblies to displace the actuating plate in a desired direction for AM and FM reception.

In one form of the invention, a further extension is provided on each of the slide assemblies which, when the slide assembly is unlocked to permit re-alignment and pre-setting of the cam carried thereby, is disposed adjacent the bistable cam member aligned with that assembly. The extension is engageable with the cam member upon displacement of the actuator plate from the FM or AM position to which the particular cam member is set to the other position. This switches the bistable cam member to its other stable position for selection of the other mode of reception. In another form of the invention, the bistable cam members may be pre-set manually by means of small projection extending downwardly through the bottom of the tuner mechanism.

A still further embodiment of the invention is for the use in connection with vertically actuated pushbutton mechanisms and includes a cam member on the actuating plate movable to one of two positions, each of which has oblique cam surfaces transverse to the vertical travel of the slide assembly. By utilizing the presettable cam on the cam slide assembly in combination with an appropriate setting of the bistable cam members on the actuator plate, the tuner may be pre-programmed to select a predetermined frequency for either AM or FM reception.

Figure 1:
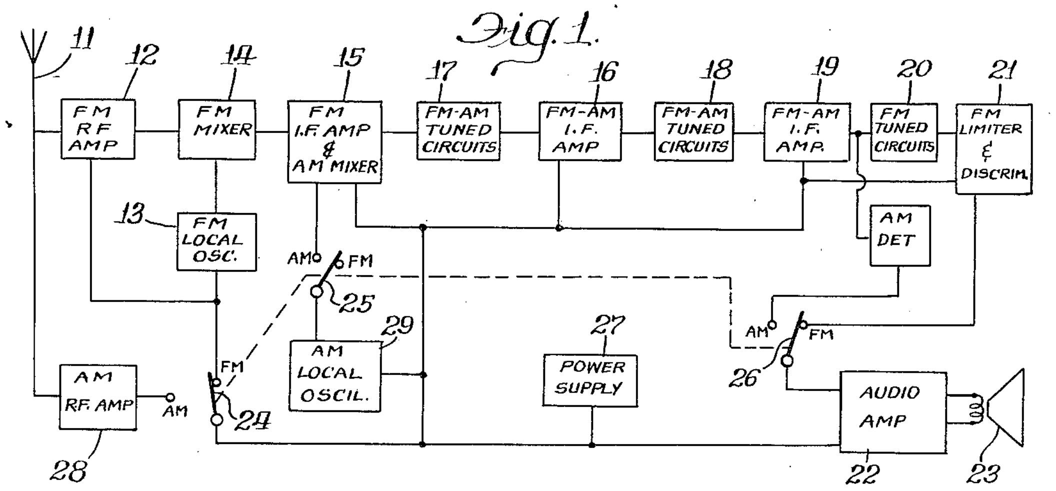
FIG. 1 is a schematic diagram of a combinaton AM-FM receiver in which the invention may be incorporated.

Referring now to FIG. 1, a combination AM-FM receiver of the type in which the invention may be incorporated is shown schematically. With the receiver providing FM operation, signals from antenna 11 are applied to radio frequency amplifier 12 and are then heterodyned against signals from local oscillator 13 in mixer 14. The intermediate frequency signals from mixer 14 are applied to a first intermediate frequency amplifier 15 and are then coupled to a second intermediate frequency amplifier 16 through FM tuned circuit 17. A further FM tuned circuit 18 couples intermediate frequency amplifier 16 to a final intermediate frequency amplifier 19. Tuned circuit 20, couples the output of intermediate frequency amplifier 19 to limiter and discriminator stages 21, which provide audio signals applied through switch 26 to the audio amplifier 22 and speaker 23.

When operating in AM mode, switches 24, 25 and 26 are moved from the FM positions shown in FIG. 1 to the AM positions. Switch 24 will therefore disconnect power supply 27 from the FM radio frequency amplifier, mixer and local oscillator, and connect it to the AM radio frequency amplifier 28. Signals from antenna 11 are thereby amplified by amplifier 28 and applied to the AM mixer stage 15, which also serves as the first intermediate frequency amplifier for the FM mode of operation. Signals from AM local oscillator 29 are heterodyned against signals from radio frequency amplifier 28 in mixer 15 and are coupled through AM tuned circuit 17 to intermediaate frequency amplifier 16. AM tuned circuit 18 couples amplifier 16 to amplifier 19, the output of which is applied to AM detector 30. Switch 26 then couples the output of AM detector 30 to the audio amplifier 22, and from there to speaker 23. Switches 24, 25 and 26 are ganged for simultaneous operation to switch the receiver from AM reception to FM reception and vice versa.

Figure 2:
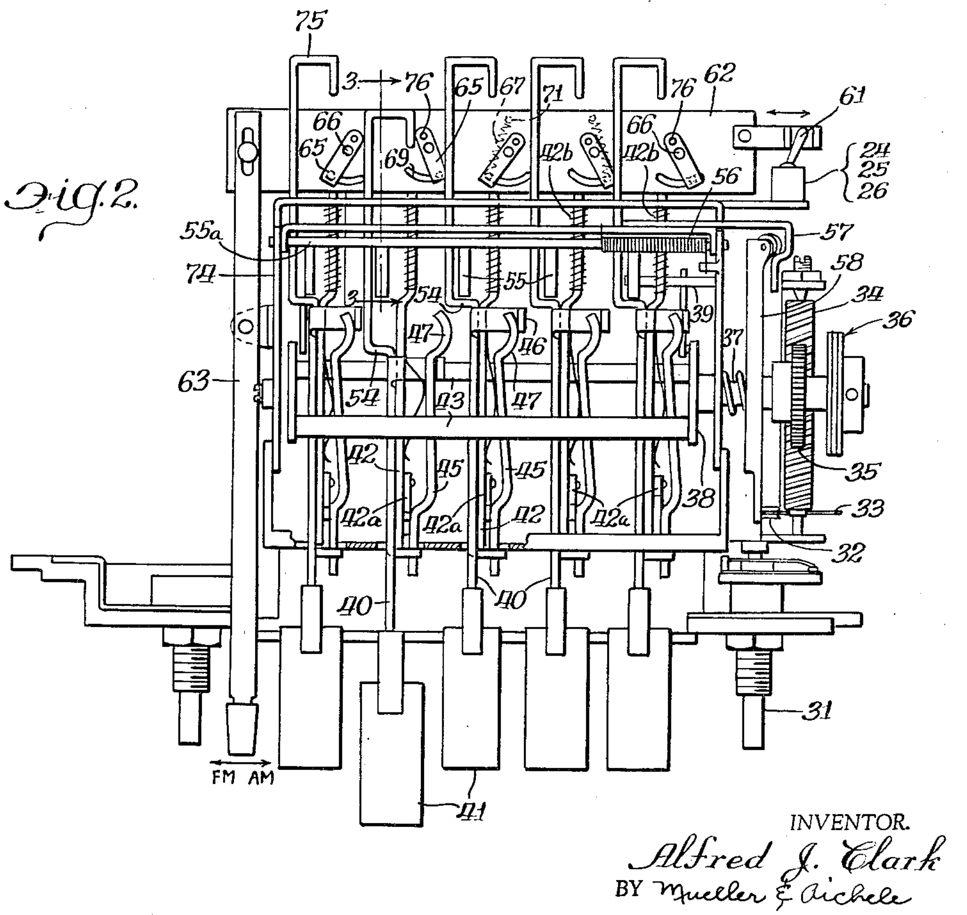
FIG. 2 is a top plan view of a turner mechanism constructed in accordance with the invention.
Figure 3:
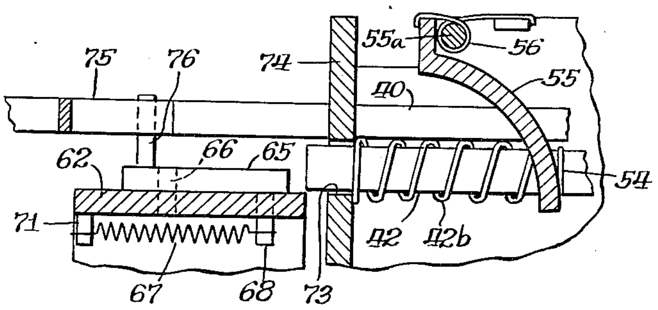
FIG. 3 is an enlarged sectional view taken along the line 3—3 of FIG. 2.

Referring now to FIGS. 2 and 3, there is shown a tuning device for use in connection with the radio receiver illustrated in FIG. 1. The tuning device shown is of the pre-programmed pushbutton selector type commonly in use on automobile radio receivers. A tuning control shaft 31, which may extend through the front of the dash panel in the automobile and is manually operable by a knob, is coupled through a pinch washer 32 and disc 33 to drive a gear 34. Gear 34 engages drive gear 35 which is coupled through a clutch 36 to tuner shaft 37. Tuner shaft 37 drives treadle arms 38 which position tuning carriage 39 to control the positioning of tuning slugs in tuning coils, not shown. Certain of the coils may be adapted for tuning the AM circuits of the receiver and other of the coils may be adapted for tuning the FM circuits. As a result, control shaft 31 may be turned to tune the receiver when operating in either AM or FM mode.

The receiver may also be tuned by a plurality of pushbuttons 41 which extend from the front of the receiver through the dash panel of the automobile. Each pushbutton controls a respective slide member 40, held in slidable relation next to a slide bar 42. Slide bar 42 carries a presettable cam 42*a* for engaging a pair of treadle bars 43. Treadle bars 43 are connected to treadle arms 38 which operate the tuning carriage 39. Accordingly, the positioning of the various cams on the slide bars 42 will align treadle bars 43 in a preset position and tune the coils to a given frequency.

Cams 42*a* are locked in position, when the pushbutton slide mechanisms are locked by means of locking levers 45 each held down by a locking portion 46 extending from slide members 40. A pushbutton cam slide assembly may be unlocked by withdrawing its pushbutton 41 outwardly of the receiver to the position shown by the second assembly from the left in FIG. 2. This moves the slide member 40 with respect to slide bar 42 (which engages the front wall of tuner frame 74) to move locking portion 46 over the hump 47 of locking lever 45, this frees the cam 42*a* so that it may be aligned with a particular setting of treadle bars 43. Further depression of the pushbutton 41 will once again lock the cam in position.

Each of cam slides 40 has a right angle portion 54 engageable with a clutch actuating lever 55, upon the depression of its pushbutton 41. Clutch actuating lever 55 will be pivoted on axle 55*a* in the direction of the arrow in FIG. 3 against the bias of a coil spring 56 to cause cam 57 to pivot a lever 58. Lever 58 is connected to disengage clutch 36 when pivoted and decoupled the tuning shaft 31 from the carriage assembly. The operation of the tuner thus far described is similar to that of the AM tuner shown in the Patent Number 2,793,531 issued to R. E. Thompson and assigned to the assignee of the present invention.

Ganged switches 24, 25 and 26 (FIG. 1) are actuable by switch element 61. Element 61 is, in turn actuable by movement of an actuating plate 62. An actuator or lever 63 may extend from plate 62 outwardly of the receiver. Lever 63 may be manually moved to selectively move plate 62 in one of the directions designated by the double arrow in FIG. 2 to thereby switch the receiver from AM mode to FM mode or vice versa.

In addition to the manual switching provisions, the tuner of the invention is also automatically switched between the two modes according to the pre-programming of a plurality of bistable cam members 65 pivoted at 66 on plate 62. Each of the cam members 65 is rendered bistable by means of a respective coil spring 67 on the underside of plate 62. Spring 67 is connected between a post 68 on cam member 65 and a post 71 fixed to plate 62. Post 68 extends down through a curved slot 69 in plate 62.

Slide bars 42 extend to the rear of the tuner and through openings 73 in tuner frame 74. Coil springs 42*b* provide an outward bias for the slide bars 42, which bias is limited by the slide bars engagement with the front wall of frame 74. When a particular pushbutton is depressed, the tip of its slide bar 42 will move through opening 73 and engage the corresponding one of cam members 65 as illustrated by the dotted line on the fourth slide assembly from the left in FIG. 2. When the cam member is set for the particular position in which the actuating plate 62 is disposed, the actuating plate will remain in that position. When, however, the particular cam member 65 is disposed as is the third cam member from the left in FIG. 2, the tip of the slide bar 42 will strike the oblique surface of the cam member, displacing plate 62 to the left, and hence moving switch element 61. Accordingly, by appropriate settings of cam members 65 and cams 42*a*, a particular pushbutton slide assembly may be pre-programmed to select either AM or FM frequencies.

In order to set up the cams 65 in the desired manner, the pushbutton slide assembly is first unlocked as shown by the second assembly from the left in FIG. 2. In this position, a U-shaped extension 75 of slide member 40 will move forward to a position adjacent a pin 76 on cam 65. If, as is shown in the second keyslide assembly from the left in FIG. 2, the cam member 65 is disposed in a position corresponding to the setting of plate 62, but it is desired to change the setting of cam 65 for the opposite mode of operation, all that is necessary is to displace plate 62 to the desired position by means of lever 63. In doing so, pin 76 will strike one of the opposite sides of extension 75 and force the cam to pivot to its other stable position. The desired frequency may then be manually tuned and the pushbutton 41 depressed to lock cam 42*a* in alignment with the particular position of treadle bars 43. That particular slide assembly will then be pre-programmed for a desired frequency and mode of operation.

Figure 4:
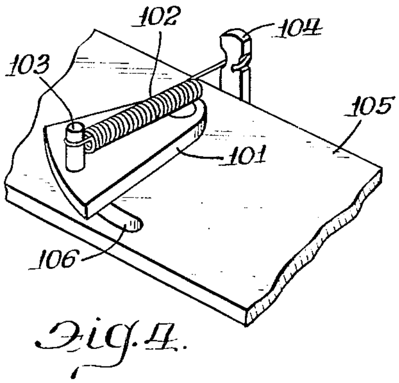
FIG. 4 is a perspective view illustrating a portion of a further embodiment of the invention.
Figure 5:
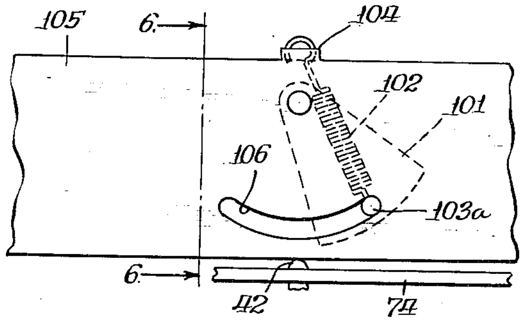
FIG. 5 is a bottom plan view of the device illustrated in FIG. 4.
Figure 6:
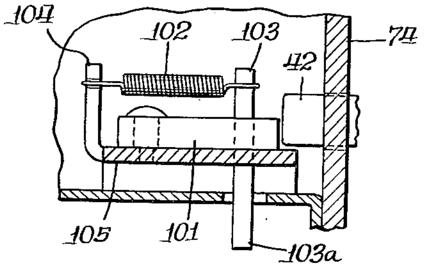
FIG. 6 is a sectional view taken along the line 6—6 of FIG. 5.

Referring now to FIGS. 4, 5 and 6, a further embodiment of the invention is shown. Here the cam member 101 to be engaged by the tip of slide bar 42 is rendered bistable by means of coil spring 102 extending between a post 103 on the cam member and a fixed post 104 on the actuating plate 105. A slot 106 is provided in plate 105 through which extends post 103 to permit the pre-setting of cam 101 manually. In this arrangement, each cam must be individually set by means of extension 103*a* of post 103, which extends below the receiver as shown in FIG. 6, for a particular selection desired.

Figure 7:
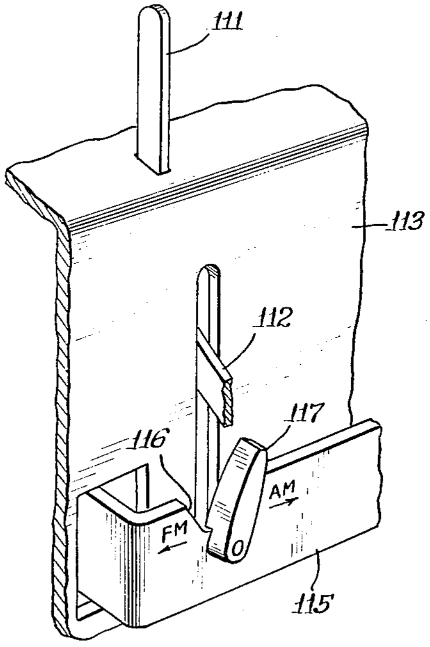
FIG. 7 is a perspective view illustrating a vertically actuated tuner mechanism constructed in accordance with the invention.

Referring now to FIG. 7, a still further embodiment of the invention is shown. FIG. 7 illustrates in perspective a portion of a pushbutton slide tuner of the vertically actuated type. The slide 111, which is similar in function to slide 40 of the tuner illustrated in FIG. 2, has an extension 112 thereon. Extension 112 protrudes through the front of the frame of the tuner 113 and through the dash panel, and the pushbutton is fixed thereon to be pressed vertically downward in order to tune the receiver.

The slidable actuating plate 115 for operating the AM-FM switch has a notch 116 formed therein which is aligned with each slide extension 112. A movable cam 117 is mounted on plate 115 to extend into notch 116. Cam 117 may be positioned in either of two angular positions as desired for AM or FM operation, in order to displace plate 115 in a given direction as it is engaged by extension 112.

It may therefore be seen that the invention provides an improved pushbutton tuning device for a combination AM-FM receiver, which device is reliable and low in cost and wherein any of the pushbuttons may be pre-programmed to select either AM or FM stations.

I claim:

1. A tuning mechanism for a use in a radio receiver selectively operable in AM and FM modes, including in combination, a pushbutton slide assembly linearly displaceable to tune the receiver to predetermined frequencies for AM and FM reception, a switch member linearly movable transversely to the displacement of said slide assembly to AM and FM positions for controlling the mode of operation of the receiver, a bistable cam member mounted on said switch member in alignment with said slide assembly, said slide assembly having a cam engaging portion, said bistable cam member being selectively pivotal to AM and FM positions to present an appropriately disposed cam surface for engagement by said cam engaging portion of said slide assembly upon displacement thereof to move said switch member to AM and FM positions respectively, whereby said bistable cam member may be positioned for moving said switch member to a given position according to a desired mode of receiver operation.

2. A tuning mechanism for use in a radio receiver selectively operable in AM and FM modes, including in combination, a plurality of pushbutton slide assemblies linearly displaceable to tune the receiver to predetermined frequencies for AM and FM reception, a switch member linearly movable transversely to the displacement of said slide assemblies for controlling the mode of operation of the receiver, a plurality of bistable cam members mounted on said switch member each in alignment with a respective one of slide assemblies, each of said slide assemblies having a cam engaging portion, said bistable cam members each having a first position presenting an oblique cam surface for engagement by said cam engaging portion of said slide assembly aligned therewith upon displacement of said slide assembly and further having a second position presenting an oblique cam surface transversely disposed to the oblique cam surface of said first position for engagement by said cam engaging portion of said slide assembly aligned therewith upon depression of said slide assembly, whereby each of said bistable cam members may be positioned for moving said switch member in a given direction according to a desired mode of receiver operation.

3. A tuning mechanism for use in a radio receiver selectively operable in AM and FM modes, including in combination, a plurality of pushbutton slide assemblies each having a presettable cam thereon and being linearly displaceable to tune the receiver to a predetermined frequency according to the position of said presettable cam, means including a switch member linearly movable transversely to the displacement of said slide assemblies for controlling the mode of operation of the receiver, a plurality of bistable cam members mounted on said switch member in alignment with respective ones of said slide assemblies, each of said slide assemblies having a cam engaging portion, said bistable cam members each having a first position presenting an oblique cam surface extending in a given direction for engagement by said cam engaging portion of said slide assembly aligned therewith upon displacement of said slide assembly and further having a second position presenting an oblique cam surface transversely disposed to said given direction for engagement by said cam engaging portion of said slide assembly aligned therewith upon displacement of said slide assembly, whereby each of said bistable cam members may be positioned for moving said switch member in a given direction according to a desired mode of receiver operation to cooperate with said presettable cam on said slide assembly aligned therewith for tuning the receiver to a predetermined frequency and mode of reception upon displacement of said slide assembly.

4. A tuning mechanism for use in a radio receiver selectively operable in AM and FM modes, including in combination, a pushbutton actuable slide assembly having a cam thereon for tuning the receiver upon displacement of said slide assembly, said slide assembly having a slide portion movable to first and second positions to respectively lock and unlock said cam to permit presetting said cam for tuning a predetermined frequency, means including a switch plate linearly movable transversely to the displacement of said slide assembly to AM and FM positions for controlling the mode of operation of the receiver, an actuator means for manually moving said plate, a bistable cam member mounted on said plate in alignment with said slide assembly, said slide assembly having a cam engaging portion, said bistable cam member being selectively pivotal to AM and FM positions to present an appropriately disposed cam surface for engagement by said cam engaging portion when said slide assembly is displaced to move said plate to AM and FM positions respectively, said bistable cam member being engageable with said slide portion of said slide assembly when said slide portion is in said second position and said plate is moved by said actuator means from the same position to which said cam member is set to the other position, whereby said bistable cam member may be positioned for moving said plate to AM and FM positions to cooperate with said cam on said slide assembly for tuning receiver to a predetermined frequency and mode of operation.

5. A tuning mechanism for use in a radio receiver selectively operable in AM and FM modes, including in combination, a pushbutton actuable slide assembly having a first cam thereon for tuning the receiver upon displacement of said slide assembly, said slide assembly having first and second parallel elongated members relatively slidable to unlock said first cam to permit presetting thereof for tuning a predetermined frequency, said first member having a pushbutton at one end thereof, said second member having a cam engaging portion at an end thereof opposite said pushbutton, means including a selector plate linearly movable transversely to the displacement of said slide assembly to AM and FM positions for controlling the mode of receiver operation, an actuator means for manually moving said plate, a bistable second cam mounted on said plate in alignment with said slide assembly, said second cam being selectively pivotal to AM and FM positions presenting an appropriately disposed cam surface for engagement by said cam engaging portion of said second member upon displacement of said slide assembly by said pushbutton, thereby moving said plate to AM and FM positions respectively, said first member having a U-shaped extension thereon at the end thereof opposite said pushbutton, said U-shaped extension being positioned adjacent said second cam when said first member is moved relative to said second member to unlock said first cam, said extension being engageable by said second cam when said plate is moved by said actuator means from the position to which said second cam is set to the other position, whereby said second cam may be positioned for moving said plate to AM and FM positions to cooperate with said slide assembly for tuning the receiver to a predetermined frequency and mode of operation.

6. A tuning mechanism for use in a radio receiver selectively operable in AM and FM modes, including in combination, a pushbutton slide assembly linearly displaceable to tune the receiver to predetemined frequencies for AM and FM reception, a switch member linearly movable transversely to the displacement of said slide assembly to AM and FM positions for controlling the mode of operation of the receiver, a bistable cam mounted on said switch member in alignment with said slide assembly, said slide assembly having a cam engaging portion, said bistable cam being selectively pivotal to AM and FM positions presenting an appropriately disposed cam surface in each position for engagement by said cam engaging portion of said slide assembly upon displacement thereof to move said switch member to AM and FM positions respectively, said bistable cam having an extension thereon to permit manual adjustment thereof selectively to AM and FM positions, whereby said bistable cam may be positioned for moving said switch member to AM and FM positions according to a desired mode of reception.

7. A tuning mechanism for use in a radio receiver selectively operable in AM and FM modes, including in combination, a vertically displaceable pushbutton slide assembly for tuning the receiver to a predetermined frequency for AM and FM reception said slide assembly having a cam engaging portion, a switch member linearly movable transversely to the displacement of said slide assembly to AM and FM positions for controlling the mode of receiver operation, a bistable cam mounted on said switch member in alignment with said slide assembly, said slide assembly having an extension thereon with a pushbutton mounted on said extension to be vertically displaceable to displace said slide assembly, said bistable cam being selectively pivotal to AM and FM positions presenting an appropriately disposed cam surface in each position for engagement by said cam engaging portion on said slide assembly upon displacement thereof to move said switch member to AM and FM positions respectively, whereby said bistable cam may be positioned for moving said switch member to AM and FM positions according to a desired mode of reception.

References Cited by the Examiner

UNITED STATES PATENTS 2,244,678 6/41 Creager -------------- 74—10.37

BROUGHTON G. DURHAM, *Primary Examiner.*

MILTON KAUFMAN, *Examiner.*